(12) United States Patent
Kang et al.

(10) Patent No.: US 7,799,643 B2
(45) Date of Patent: Sep. 21, 2010

(54) METHOD OF FABRICATING SEMICONDUCTOR DEVICE HAVING SELF-ALIGNED CONTACT PLUG

(75) Inventors: Nam-Jung Kang, Gyeonggi-do (KR); Dong-Soo Woo, Seoul (KR); Hyeong-Sun Hong, Gyeonggi-do (KR); Dong-Hyun Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 148 days.

(21) Appl. No.: 12/112,438

(22) Filed: Apr. 30, 2008

(65) Prior Publication Data

US 2008/0283957 A1 Nov. 20, 2008

(30) Foreign Application Priority Data

May 18, 2007 (KR) ...................... 10-2007-0048763

(51) Int. Cl.
*H01L 21/336* (2006.01)
(52) U.S. Cl. ..................................................... 438/272
(58) Field of Classification Search ................. 257/349, 257/216, E29.233, E29.27, E21.339, E21.537, 257/E21.63, E21.653; 438/76, 146, 175, 438/262, 282, 370, 526, FOR. 160, FOR. 257, 438/672, FOR. 189, FOR. 212, 272
See application file for complete search history.

(56) References Cited

U.S. PATENT DOCUMENTS

| 7,105,453 | B2 | 9/2006 | Chen et al. | |
|---|---|---|---|---|
| 7,572,721 | B2* | 8/2009 | Kim | ............................ 438/586 |
| 2003/0127677 | A1* | 7/2003 | Park et al. | ..................... 257/300 |
| 2005/0173744 | A1* | 8/2005 | Kim et al. | ..................... 257/296 |
| 2005/0186781 | A1* | 8/2005 | Park | ............................ 438/637 |
| 2006/0234437 | A1* | 10/2006 | Kim et al. | ..................... 438/218 |
| 2006/0276019 | A1 | 12/2006 | Graf et al. | |

FOREIGN PATENT DOCUMENTS

| JP | 2000-315777 | 11/2000 |
|---|---|---|
| JP | 2003-017585 | 1/2003 |
| KR | 10-1998-0083674 | 12/1998 |
| KR | 102000004548 A | 1/2000 |
| KR | 1020030011485 A | 2/2003 |
| KR | 10-2004-0102310 | 12/2004 |
| KR | 10-2005-0116311 | 12/2005 |

* cited by examiner

*Primary Examiner*—N Drew Richards
*Assistant Examiner*—Grant S Withers
(74) *Attorney, Agent, or Firm*—Myers Bigel Sibley & Sajovec

(57) ABSTRACT

Methods of fabricating a semiconductor device having a self-aligned contact plug are provided. Methods include forming a lower insulating layer on a semiconductor substrate, forming a plurality of interconnection patterns parallel to each other on the lower insulating layer; forming an upper insulating layer that is configured to fill between the interconnection patterns, and forming a plurality of first mask patterns crossing the plurality of interconnection patterns, ones of the plurality of first mask patterns parallel to each other on the semiconductor substrate having the upper insulating layer. Methods may include forming a second mask pattern that is self-aligned to the plurality of first mask patterns and that is between ones of the plurality of first mask patterns, etching the upper insulating layer and the lower insulating layer using the first and second mask patterns and the plurality of interconnection patterns as etch masks to form a plurality of contact holes exposing the semiconductor substrate, and forming a plurality of contact plugs in respective ones of the plurality of contact holes. Semiconductor devices are also provided.

17 Claims, 7 Drawing Sheets

METHOD OF FABRICATING SEMICONDUCTOR DEVICE HAVING SELF-ALIGNED CONTACT PLUG

CROSS-REFERENCE TO RELATED APPLICATION

This application claims the benefit of Korean Patent Application No. 10-2007-0048763, filed May 18, 2007, the contents of which are hereby incorporated herein by reference in their entirety.

BACKGROUND OF THE INVENTION

The present invention relates to semiconductor devices and methods of fabricating the same, and more particularly, to methods of fabricating memory and related devices.

As a semiconductor device becomes highly integrated, stable operations of a transistor may not be ensured. Research into a buried channel array transistor (BCAT) has been extensively conducted to overcome a short channel effect and to reduce the size of a transistor.

The BCAT may be formed to bury a gate electrode in a semiconductor substrate. A capping pattern may be provided on the buried gate electrode. An upper surface of the capping pattern may be formed at the same level as that of the semiconductor substrate. That is, the buried gate electrode may be covered with the capping pattern, and provided at a lower level than the upper surface of the semiconductor substrate. Source and drain regions may be provided at both sides of the buried gate electrode in the semiconductor substrate. As a result, the BCAT may have a longer effective channel length than a planar transistor. In other words, the BCAT may have a structure suitable for high integration density.

Semiconductor devices such as a dynamic random access memory (DRAM) may include a plurality of BCATs. Also, the semiconductor devices may adopt interconnections such as bit lines and buried contact plugs as components. For example, the semiconductor substrate having the BCAT may be covered with an interlayer insulating layer. The bit line may be disposed in the interlayer insulating layer. The bit line may be in contact with selected one of the source and drain regions by a bit plug passing through the interlayer insulating layer. A storage node may be disposed on the interlayer insulating layer. The storage node may be in contact with the other of the source and drain regions by a buried contact plug passing through the interlayer insulating layer.

The buried contact plug should be insulated from the bit line and the bit plug. Meanwhile, as the BCAT is fabricated to be reduced, a space on which the buried contact plug can be disposed may become narrower. That is, forming the buried contact plug to be insulated from the bit line and the bit plug may become difficult.

Another method of forming a contact plug on a semiconductor substrate is disclosed in U.S. Patent Publication No. U.S. 2006/0276019 entitled "Method for Production of Contacts on a Wafer" to Graf.

According to Graft a method of forming contact holes using a bar-type mask pattern formed by a photolithography process may be provided. In this case, the size of the contact holes and the distance between the contact holes are determined by resolution limit of photolithography. In other words, there may be a limit in reductions to the size of the contact holes and the distance between the contact holes.

SUMMARY OF THE INVENTION

Some embodiments of the present invention provide methods of forming a contact plug having a sufficient process margin. In some embodiments, methods of fabricating a semiconductor device may include forming a lower insulating layer on a semiconductor substrate, forming multiple interconnection patterns parallel to each other on the lower insulating layer, and forming an upper insulating layer that is configured to fill between the interconnection patterns. Some embodiments may include forming multiple first mask patterns crossing the interconnection patterns, ones of the first mask patterns parallel to each other on the semiconductor substrate having the upper insulating layer and forming a second mask pattern that is self-aligned to the first mask patterns and that is between ones of the first mask patterns. Methods may include etching the upper insulating layer and the lower insulating layer using the first and second mask patterns and the interconnection patterns as etch masks to form multiple contact holes exposing the semiconductor substrate and forming multiple contact plugs in respective ones of the contact holes.

In some embodiments, forming the first mask patterns includes forming a first sacrificial layer on the semiconductor substrate having the upper insulating layer, forming a first mask layer on the first sacrificial layer, and patterning the first mask layer and the first sacrificial layer. Some embodiments provide that the first mask layer includes a polysilicon layer.

In some embodiments, forming the first mask patterns includes forming the first mask patterns perpendicular to the interconnection patterns. Some embodiments provide that forming the second mask pattern includes forming a second sacrificial layer covering the semiconductor substrate having the first mask patterns, forming a second mask layer that fills between the first mask patterns and covers the second sacrificial layer, and planarizing the second mask layer. In some embodiments, the second mask layer includes a polysilicon layer. In some embodiments, the sacrificial layer includes a material layer having an etch selectivity with respect to the first mask patterns and the second mask pattern.

In some embodiments, forming the interconnection patterns includes forming a conductive layer on the lower insulating layer, forming a capping layer on the conductive layer, and patterning the capping layer and the conductive layer to form capping patterns and interconnections. Some embodiments include, before forming the first mask patterns, etching-back the interconnection patterns to form grooves and forming sacrificial capping patterns to fill the grooves using the same material layer as the second mask pattern.

Some embodiments of the present invention include methods of fabricating a dynamic random access memory (DRAM). Some embodiments of such methods include defining multiple active regions that are two-dimensionally aligned along a column direction and a row direction in a semiconductor substrate, forming a lower insulating layer on the semiconductor substrate that includes the active regions and forming multiple bit patterns crossing the active regions, ones of the bit patterns parallel to each other on the lower insulating layer. Methods may include forming an upper insulating layer that is configured to fill between ones of the bit patterns, forming multiple first mask patterns crossing the bit patterns, ones of the first mask patterns parallel to each other on the semiconductor substrate that includes the upper insulating layer, and forming a second mask pattern self-aligned to the first mask patterns between ones of the first mask patterns. Methods may include etching the upper insulating layer and the lower insulating layer using the first mask patterns, the second mask pattern and the bit patterns as etch masks to form multiple buried contact holes exposing the active regions, forming multiple buried contact plugs in the buried contact holes, and forming multiple storage nodes on respective ones of the buried contact plugs.

In some embodiments, the bit patterns are formed to obliquely cross the active regions. In some embodiments, the first mask patterns are formed perpendicular to the bit patterns and intersections of ones of the first mask patterns and ones of the bit patterns are disposed on the active regions. Some embodiments provide that intersections of the second mask pattern and ones of the bit patterns are disposed between the active regions.

In some embodiments, forming the bit patterns includes forming a bit conductive layer on the lower insulating layer, forming a bit capping layer on the bit conductive layer and patterning the bit capping layer and the bit conductive layer to form multiple bit capping patterns and bit lines.

Some embodiments include, before forming the first mask patterns, etching-back the bit patterns to form multiple grooves and forming multiple sacrificial capping patterns that are configured to fill the grooves using the same material layer as the second mask pattern. In some embodiments, forming the first mask patterns includes forming a first sacrificial layer on the semiconductor substrate including the upper insulating layer, forming a first mask layer on the first sacrificial layer and patterning the first mask layer and the first sacrificial layer. Some embodiments provide that the first mask layer includes a polysilicon layer.

In some embodiments, forming the second mask pattern includes forming a second sacrificial layer covering a surface of the semiconductor substrate having the first mask patterns, forming a second mask layer which fills between ones of the first mask patterns and covers the second sacrificial layer, and planarizing the second mask layer. Some embodiments provide that the second mask layer includes a polysilicon layer.

Some embodiments include, before forming the lower insulating layer, forming multiple buried word lines crossing the active regions, such that ones of the buried word lines are parallel to each other on the semiconductor substrate, and forming multiple word capping patterns covering the buried word lines, wherein the buried word lines are disposed at a lower level than upper surfaces of the active regions. In some embodiments, the buried word lines are formed perpendicular to the bit patterns, each of the active regions crosses a pair of the buried word lines, and intersections of ones of the first mask patterns and ones of the bit patterns are disposed on the active regions between the pair of the buried word lines.

In some embodiments, forming the buried contact plugs includes forming a buried contact conductive layer which fills the buried contact holes and covers the semiconductor substrate, and planarizing the first mask patterns, the second mask pattern and the buried contact conductive layer until the bit patterns are exposed.

Some embodiments of the present invention include a semiconductor device that includes multiple active regions that are two-dimensionally aligned along a column direction and a row direction in a semiconductor substrate and an interlayer insulating layer covering the semiconductor substrate having the active regions. Embodiments of a device may include multiple bit patterns crossing the active regions and parallel to each other on the interlayer insulating layer, multiple first insulating patterns spaced apart from each other between ones of the bit patterns and a second insulating pattern self-aligned between the first insulating patterns. A device may include multiple buried contact plugs disposed between the second insulating pattern, the first insulating patterns and the bit patterns, and contacting the active regions through the interlayer insulating layer.

In some embodiments, each of the buried contact plugs includes a width smaller than a resolution limit of photolithography. In some embodiments, the second insulating pattern includes a width smaller than a resolution limit of photolithography. Some embodiments provide that the active regions include a first active region, a second active region aligned in the column direction of the first active region, a third active region aligned in the row direction of the first active region and a fourth active region aligned in the row direction of the second active region.

In some embodiments, the bit patterns include a first bit pattern crossing the first and second active regions and a second bit pattern crossing the third and fourth active regions, such that the first and second bit patterns obliquely cross the active regions. Some embodiments include first and second buried word lines crossing the first and third active regions and parallel to each other and third and fourth buried word lines crossing the second and fourth active regions and parallel to each other, such that the first, second, third, and fourth buried word lines are perpendicular to the first and second bit patterns, one of the first insulating patterns is disposed between the first and second buried word lines and on the first and second buried word lines, and another of the first insulating patterns is disposed between the third and fourth buried word lines and on the third and fourth buried word lines.

Some embodiments provide that the buried word lines are disposed at a lower level than upper surfaces of the active regions. Some embodiments include storage nodes disposed on the buried contact plugs.

DETAILED DESCRIPTION OF THE INVENTION

Figure 1:
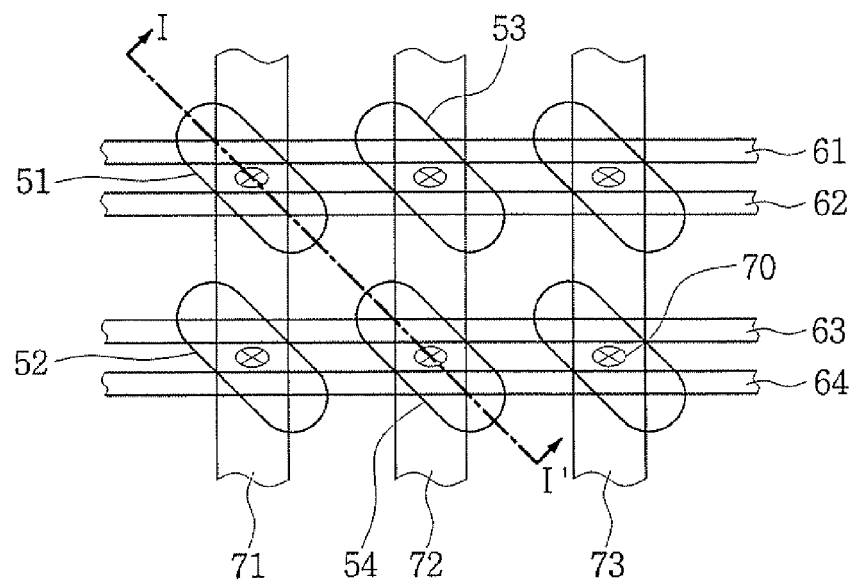
FIGS. 1, 5, 7 and 10 are plan views illustrating methods of fabricating dynamic random access memory (DRAM) according to some embodiments of the present invention.

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation. Like numbers refer to like elements throughout.

In the figures, the dimensions of structural components, including layers and regions among others, are not to scale and may be exaggerated to provide clarity of the concepts herein. It will also be understood that when a layer (or layer) is referred to as being 'on' another layer or substrate, it can be directly on the other layer or substrate, or can be separated by intervening layers. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Methods of manufacturing dynamic random access memory (DRAM) according to some embodiments of the present invention will now be described with reference to FIGS. 1 to 13b.

Figure 2:
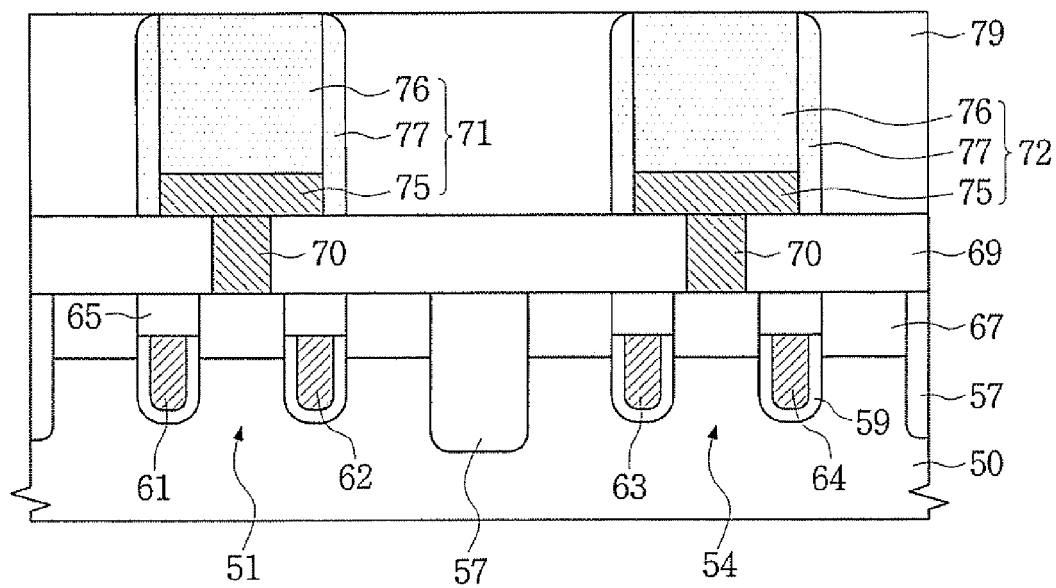
FIGS. 2 to 4 are cross-sectional views taken along line I-I' of FIG. 1.

Referring to FIGS. 1 and 2, an isolation layer 57 defining active regions 51, 52, 53 and 54 may be formed in a semiconductor substrate 50. In some embodiments, the semiconductor substrate 50 may be a silicon wafer. Some embodiments provide that the isolation layer 57 may be formed using a shallow trench isolation (STI) technique. In some embodiments, the isolation layer 57 may be formed of a silicon oxide layer, a silicon nitride layer, a silicon oxynitride layer, and/or a combination thereof.

The active regions 51, 52, 53 and 54 may be formed to be two-dimensionally aligned along a column direction and a row direction. Also, the active regions 51, 52, 53 and 54 may be formed to be aligned parallel to each other. For example, a second active region 52 may be aligned in the column direction with respect to a first active region 51, a third active region 53 may be aligned in the row direction with respect to the first active region 51, and a fourth active region 54 may be aligned in the row direction with respect to the second active region 52. In some embodiments, upper surfaces of the active regions 51, 52, 53 and 54 and the isolation layer 57 may be exposed on the same plane.

The active regions 51, 52, 53 and 54 and the isolation layer 57 may be patterned to form gate grooves. Gate dielectric layers 59 may be formed on sidewalls and bottoms of the gate grooves. Buried word lines 61, 62, 63 and 64 partially filling the gate grooves may be formed on the gate dielectric layers 59. Word capping patterns 65 may be formed on the buried word lines 61, 62, 63 and 64. High-concentration impurity ions may be implanted into the active regions 51, 52, 53 and 54 at both sides of the buried word lines 61, 62, 63 and 64 to form source and drain regions 67. Upper surfaces of the word capping patterns 65, the source and drain regions 67 and the isolation layer 57 may be exposed on the same plane.

In some embodiments, the gate dielectric layers 59 may be formed of a silicon oxide layer, a silicon nitride layer, a silicon oxynitride layer, a high-k dielectric layer, and/or a combination thereof. In some embodiments, the buried word lines 61, 62, 63 and 64 may be formed of a conductive layer such as a metal layer, a metal silicide layer, a metal nitride layer, a polysilicon layer, and/or a combination thereof. For example, the buried word lines 61, 62, 63 and 64 may be formed of a TiN layer. The word capping patterns 65 may be formed of an insulating layer such as a silicon oxide layer, a silicon nitride layer, a silicon oxynitride layer, and/or a combination thereof.

In some embodiments, the buried word lines 61, 62, 63 and 64 may be formed at a lower level than upper surfaces of the active regions 51, 52, 53 and 54. That is, the buried word lines 61, 62, 63 and 64 may be formed at a lower level than upper surfaces of the source and drain regions 67. Some embodiments provide that the buried word lines 61, 62, 63 and 64 may be formed parallel to each other.

As illustrated, a first buried word line 61 may be formed to cross the first and third active regions 51 and 53. In some embodiments, each of the first and third active regions 51 and 53 may be formed to obliquely cross the first buried word line 61. A second buried word line 62 may be formed parallel to the first buried word line 61 and across the first and third active regions 51 and 53. Similarly, third and fourth buried word lines 63 and 64 may be formed to cross the second and fourth active regions 52 and 54.

A lower insulating layer 69 may be formed on the semiconductor substrate 50 having the buried word lines 61, 62, 63 and 64. The lower insulating layer 69 may be formed of a silicon oxide layer, a silicon nitride layer, a silicon oxynitride layer, and/or a combination thereof.

In some embodiments, the lower insulating layer 69 may be patterned to form bit contact holes exposing the source and drain regions 67 between the first and second buried word lines 61 and 62, and the source and drain regions 67 between the third and fourth buried word lines 63 and 64. Bit plugs 70 filling the bit contact holes may be formed.

Some embodiments provide that bit patterns 71, 72 and 73 in contact with the bit plugs 70 and parallel to each other may be formed on the lower insulating layer 69. The bit patterns 71, 72 and 73 may be formed of bit lines 75 and bit capping patterns 76, which may be sequentially stacked. The bit patterns 71, 72 and 73 may be formed to have bit spacers 77 covering sidewalls of the bit lines 75 and the bit capping patterns 76.

For example, a bit conductive layer may be formed on the lower insulating layer 69. In some embodiments, a bit capping layer may be formed on the bit conductive layer. The bit capping layer and the bit conductive layer may be patterned to form the bit capping patterns 76 and the bit lines 75. A spacer layer covering the bit capping patterns 76 and the bit lines 75 may be formed. In some embodiments, the spacer layer may be anisotropically etched to form the bit spacers 77.

The bit plugs 70 and the bit lines 75 may be formed of a conductive layer such as a metal layer, a metal silicide layer, a metal nitride layer, a polysilicon layer, and/or a combination thereof. In some embodiments, the bit capping patterns 76 may be formed of a material layer having an etch selectivity with respect to the lower insulating layer 69. The bit capping patterns 76 may be formed of a silicon oxide layer, a silicon nitride layer, a silicon oxynitride layer, and/or a combination thereof. For example, when the lower insulating layer 69 is a silicon oxide layer, the bit capping patterns 76 may be formed of a silicon nitride layer. The bit spacers 77 may be formed of a silicon oxide layer, a silicon nitride layer, a silicon oxynitride layer, and/or a combination thereof.

The bit patterns 71, 72 and 73 may be formed to cross over the buried word lines 61, 62, 63 and 64. Further, in some embodiments the bit patterns 71, 72 and 73 may be formed perpendicular to the buried word lines 61, 62, 63 and 64. Some embodiments provide that the bit patterns 71, 72 and 73 may be formed to obliquely cross over the active regions 51, 52, 53 and 54. In such embodiments, the active regions 51, 52, 53 and 54 may be obliquely formed at intersections of the bit patterns 71, 72 and 73 and the buried word lines 61, 62, 63 and 64. More specifically, a first bit pattern 71 may be formed to cross over the first and second active regions 51 and 52. Similarly, a second bit pattern 72 may be formed to cross the third and fourth active regions 53 and 54.

An upper insulating layer 79 may be formed on the semiconductor substrate 50 having the bit patterns 71, 72 and 73. In some embodiments, the upper insulating layer 79 may be planarized to expose upper surfaces of the bit patterns 71, 72 and 73. In other words, the upper insulating layer 79 may be formed to fill gap regions between the bit patterns 71, 72 and 73. Some embodiments provide that the upper insulating layer 79 may be formed of a material layer having an etch selectivity with respect to the bit capping patterns 76. The upper insulating layer 79 may be formed of a silicon oxide layer, a silicon nitride layer, a silicon oxynitride layer, and/or a combination thereof. For example, when the bit capping patterns 76 are formed of a silicon nitride layer, the upper insulating layer 79 may be formed of a silicon oxide layer. In some embodiments, the upper insulating layer 79 may be planarized using a chemical mechanical polishing (CMP) process and/or an etch-back process.

Figure 3:
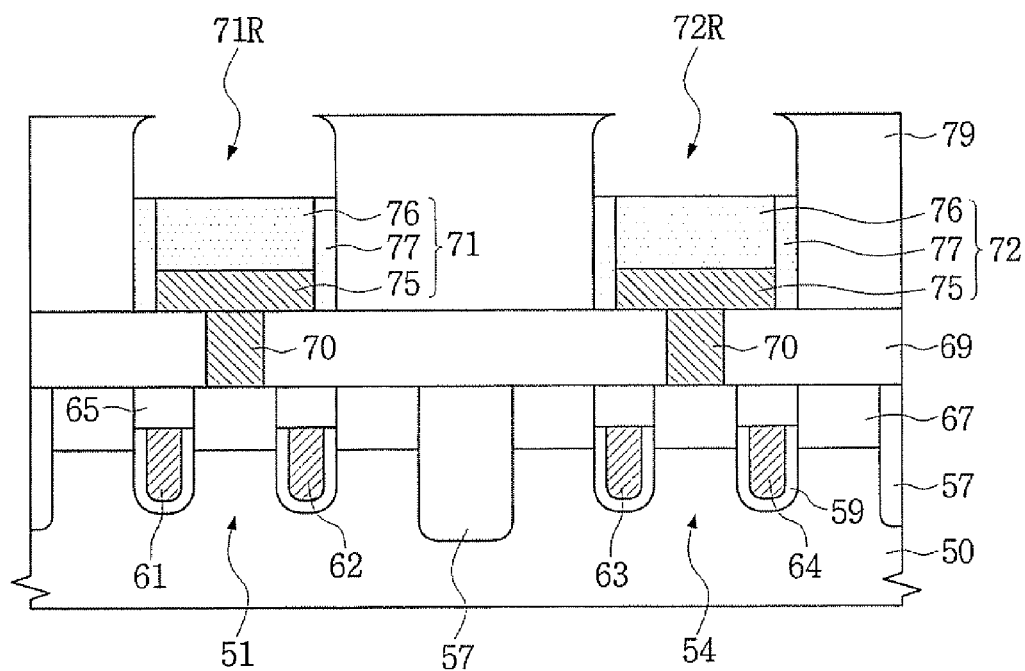

Referring to FIGS. 1 and 3, the bit patterns 71, 72 and 73 may be etched-back to form grooves 71R and 72R. Some embodiments provide that the bit patterns 71, 72 and 73 may be etched-back using an isotropic etching process. In some embodiments, the bit capping patterns 76 may be partially etched to be recessed downward. Some embodiments provide that, at the same time, the bit spacers 77 may be partially etched.

Figure 4:
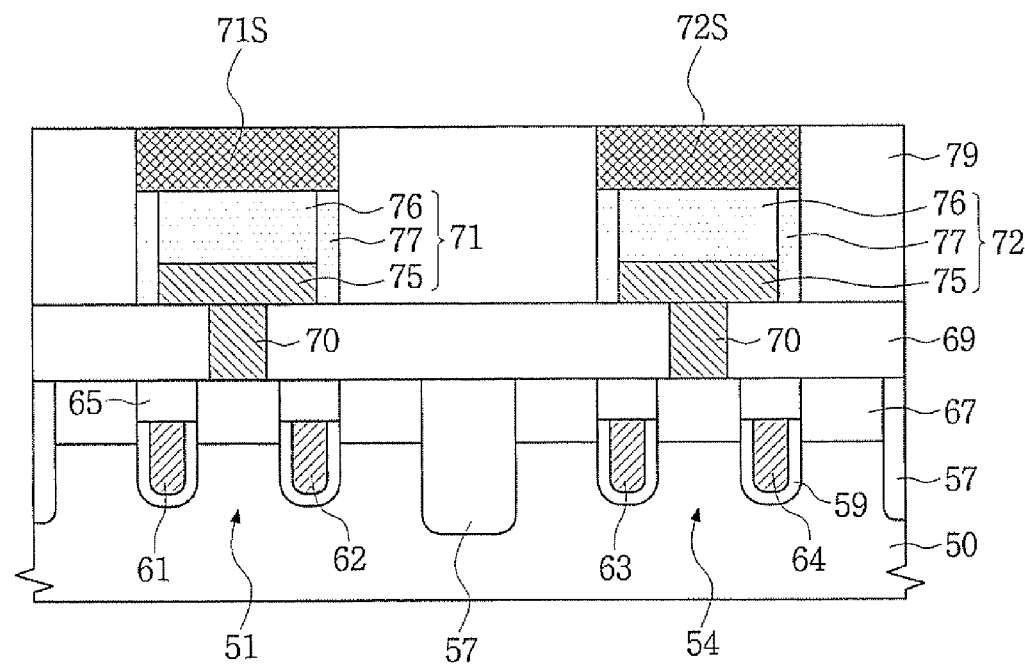

Referring to FIGS. 1 and 4, sacrificial capping patterns 71S and 72S filling the grooves 71R and 72R may be formed. Some embodiments provide that the sacrificial capping patterns 71S and 72S may be formed of a material layer having an etch selectivity with respect to the upper insulating layer 79 and the lower insulating layer 69. In some embodiments, the sacrificial capping patterns 71S and 72S may be formed of a polysilicon layer.

More specifically, a sacrificial capping layer filling the grooves 71R and 72R and covering the upper insulating layer 79 may be formed. The sacrificial capping layer may be planarized to form the sacrificial capping patterns 71S and 72S. A CMP process and/or an etch-back process may be applied to the planarization of the sacrificial capping layer. In some embodiments, the formation of the grooves 71R and 72R and the sacrificial capping patterns 71S and 72S may be omitted.

Figure 5:
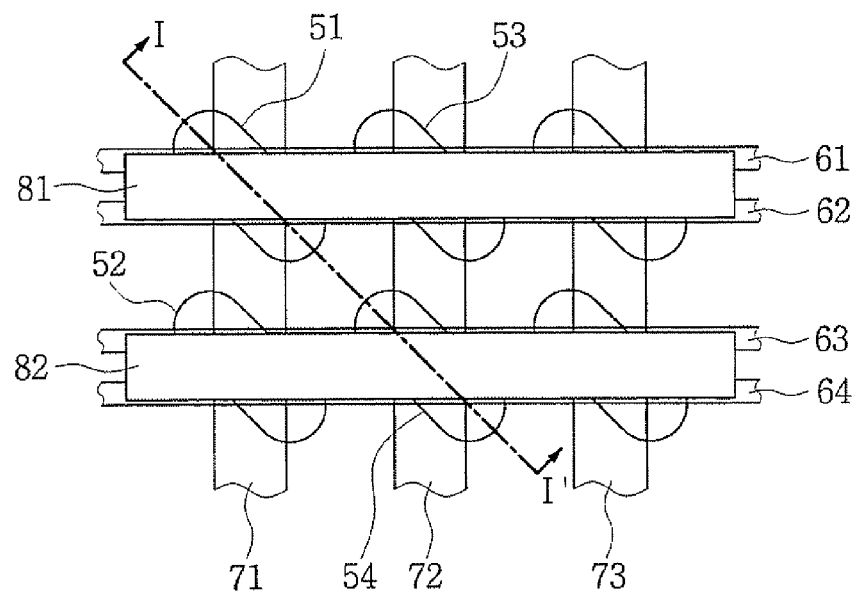
Figure 6:
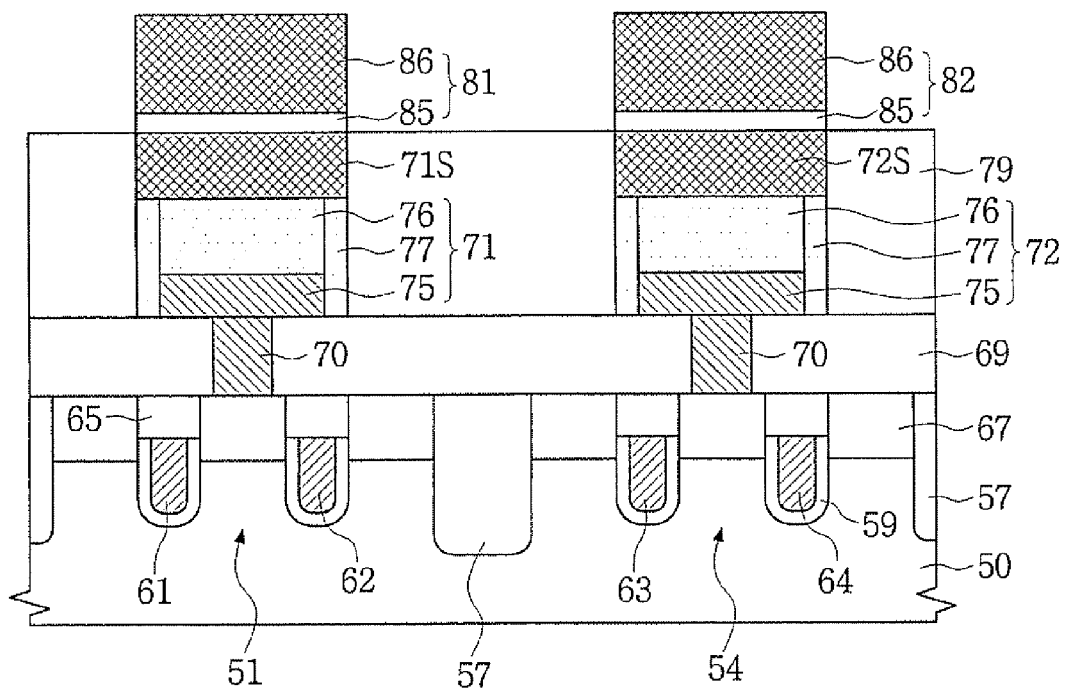
FIG. 6 is a cross-sectional view taken along line I-I' of FIG. 5.

Referring to FIGS. 5 and 6, first mask patterns 81 and 82 parallel to each other may be formed on the upper insulating layer 79. More specifically, a first sacrificial layer 85 and a first mask layer 86 may be sequentially stacked on the sacrificial capping patterns 71S and 72S and the upper insulating layer 79, Some embodiments provide that the first mask layer 86 and the first sacrificial layer 85 may be sequentially patterned to form the first mask patterns 81 and 82. In some embodiments, the first sacrificial layer 85 may be formed of a silicon oxide layer. Some embodiments provide that the first mask layer 86 may be formed of a material layer having an etch selectivity with respect to the upper insulating layer 79. In some embodiments, the first mask layer 86 may be formed of a polysilicon layer. In some embodiments, the first sacrificial layer 85 may be omitted.

In some embodiments, the first mask patterns 81 and 82 may be formed to cross over the bit patterns 71, 72 and 73. Furthermore, the first mask patterns 81 and 82 may be formed perpendicular to the bit patterns 71, 72 and 73. Some embodiments provide that the first mask patterns 81 and 82 may be formed to cover the bit plugs 70. In some embodiments, the upper insulating layer 79 and the sacrificial capping patterns 71S and 72S may be exposed between the first mask patterns 81 and 82.

As illustrated, one of the first mask patterns 81 and 82 may be formed to cover the first and second buried word lines 61 and 62, and the other of the first mask patterns 81 and 82 may be formed to cover the third and fourth buried word lines 63 and 64. In some embodiments, the source and drain regions 67 between the first and second buried word lines 61 and 62 may be covered with one of the first mask patterns 81 and 82. Some embodiments provide that the source and drain regions 67 between the third and fourth buried word lines 63 and 64 may be covered with the other of the first mask patterns 81 and 82. In such embodiments, the active regions 51, 52, 53 and 54 may be disposed at intersections of the first mask patterns 81 and 82 and the bit patterns 71, 72 and 73.

Figure 7:
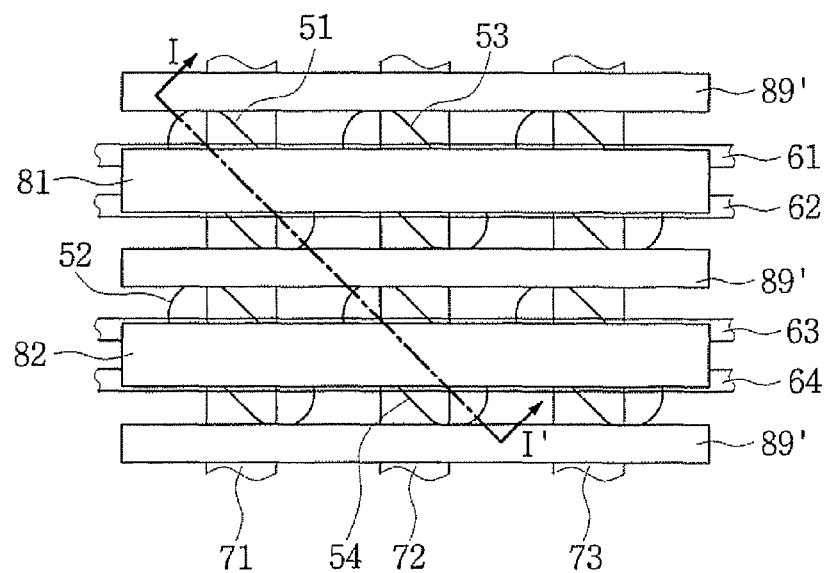
Figure 8:
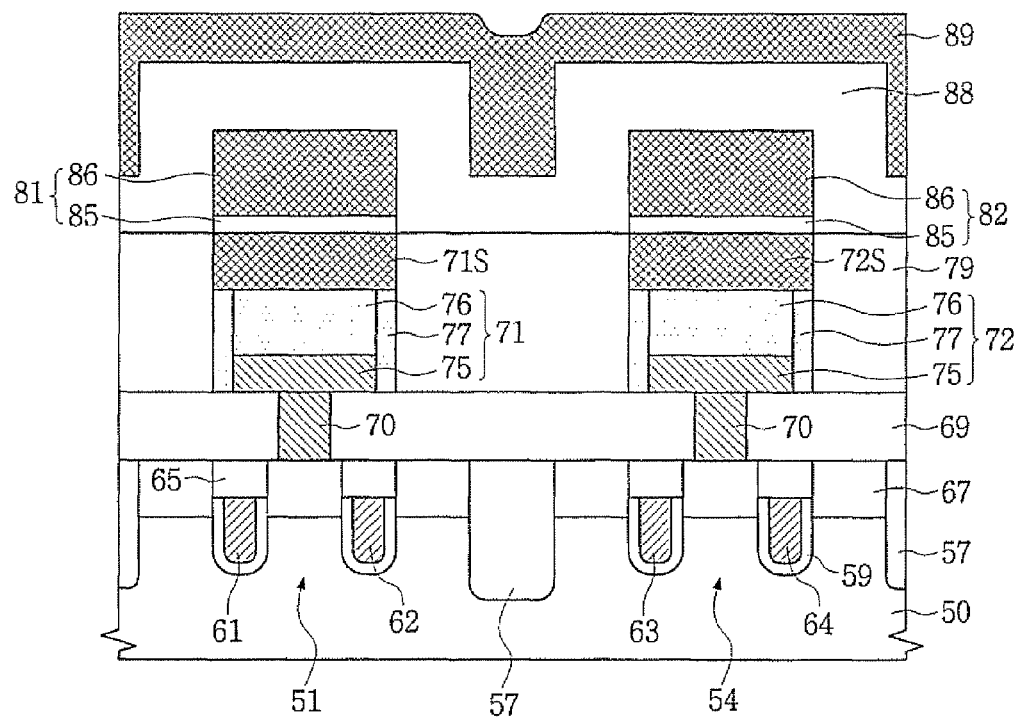
FIGS. 8 and 9 are cross-sectional views taken along line I-I' of FIG. 7.

Referring to FIGS. 7 and 8, a second sacrificial layer 88 may be formed on the semiconductor substrate 50 having the first mask patterns 81 and 82. In some embodiments, the second sacrificial layer 88 may be formed along an upper surface of the semiconductor substrate 50. Some embodiments provide that the second sacrificial layer 88 may cover sidewalls of the first mask patterns 81 and 82.

In some embodiments, the second sacrificial layer 88 may be formed of the same material layer as the upper insulating layer 79. The second sacrificial layer 88 may be formed of a material layer having excellent step coverage. For example, some embodiments provide that the second sacrificial layer 88 may be formed of a silicon oxide layer using an atomic layer deposition (ALD) method.

In some embodiments, a second mask layer 89 may be formed on the second sacrificial layer 88. The second mask layer 89 may fill a gap region between the first mask patterns 81 and 82 and cover the semiconductor substrate 50. The second mask layer 89 may be formed of the same material layer as the first mask layer 86. Some embodiments provide that the second mask layer 89 may be formed of a polysilicon layer.

Figure 9:
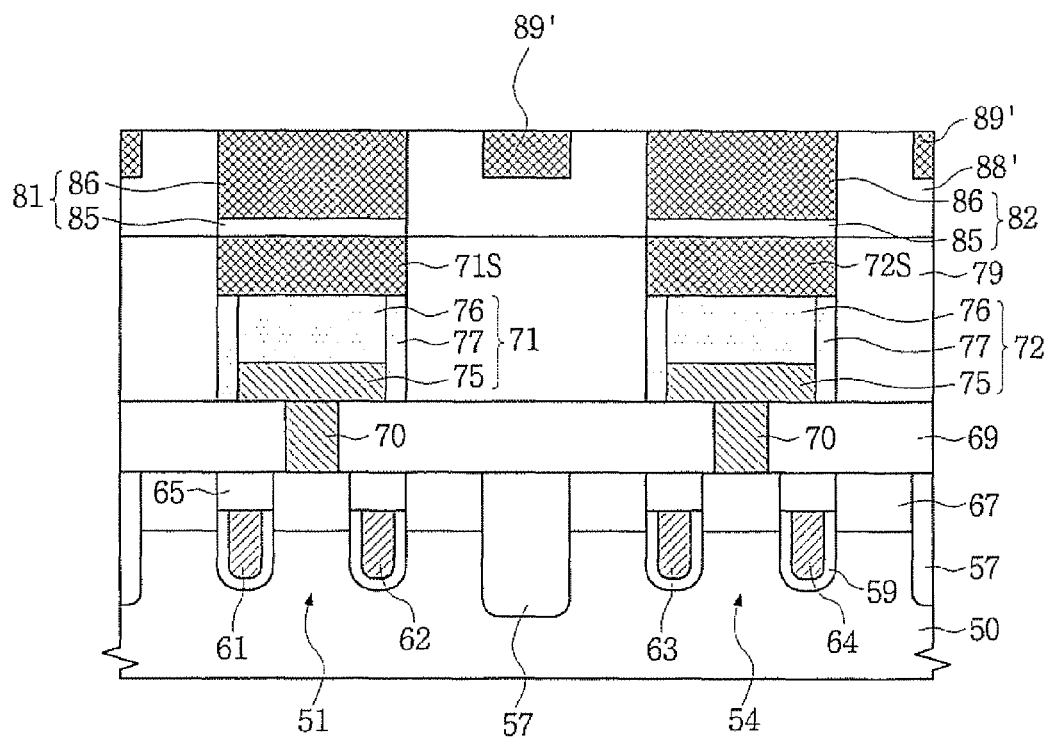

Referring to FIGS. 7 and 9, the second mask layer 89 and the second sacrificial layer 88 may be planarized to form second mask patterns 89' and second sacrificial patterns 88'. A CMP process and/or an etch-back process may be employed to planarize the second mask layer 89 and the second sacrificial layer 88. As a result, upper surfaces of the first mask patterns 81 and 82 and the second mask patterns 89' may be exposed on the same plane. In some embodiments, the second sacrificial patterns 88' may remain between the first mask patterns 81 and 82 and the second mask patterns 89'.

Some embodiments provide that each of the second mask patterns 89' may be self-aligned between the first mask patterns 81 and 82. In some embodiments, the thickness of the second sacrificial layer 88 may be adjusted to control a distance between the first mask patterns 81 and 82 and the second mask patterns 89'. The second mask patterns 89' may not require photolithography. Thus, the second mask patterns 89' may be formed to a width smaller than the resolution limit of photolithography. In some embodiments, a distance between the first mask patterns 81 and 82 and the second mask patterns 89' may be formed to a width smaller than the resolution limit of photolithography.

In some embodiments of the present invention, the planarization of the second sacrificial layer 88 may be omitted. Accordingly, some embodiments provide that the second sacrificial layer 88 may cover the first mask patterns 81 and 82.

Figure 10:
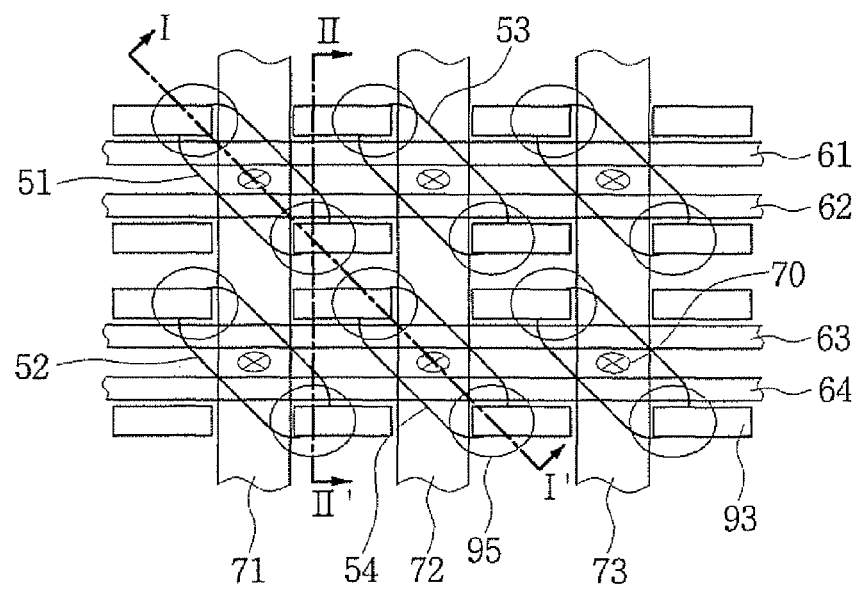
Figure 11:
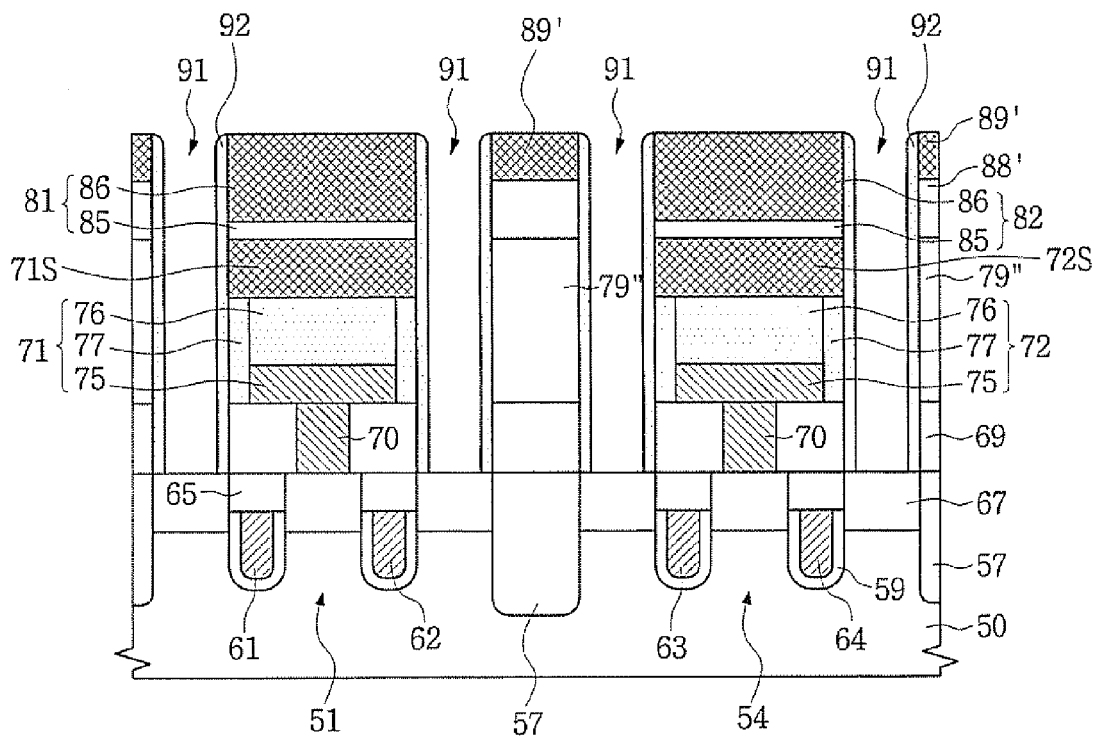
FIGS. 11, 12 and 13a are cross-sectional views taken along line I-I' of FIG. 10.

Referring to FIGS. 10 and 11, the upper insulating layer 79 and the lower insulating layer 69 may be etched using the first mask patterns 81 and 82, the second mask patterns 89' and the sacrificial capping patterns 71S and 72S as etch masks to form buried contact holes 91. In some embodiments, when the sacrificial capping patterns 71S and 72S are omitted, the bit patterns 71, 72 and 73 may act as the etch masks. Some embodiments provide that the buried contact holes 91 may be formed to a width smaller than the resolution limit of photolithography.

In some embodiments, the second sacrificial patterns 88' may be anisotropically etched and removed using the first mask patterns 81 and 82 and the second mask patterns 89' as etch masks. Some embodiments provide that the second sacrificial patterns 88' may remain below the second mask patterns 89'. In some embodiments, the upper insulating layer 79 and the sacrificial capping patterns 71S and 72S may be exposed between the first mask patterns 81 and 82 and the second mask patterns 89'. Afterwards, the upper insulating layer 79 and the lower insulating layer 69 may be anisotropically etched using the first mask patterns 81 and 82, the second mask patterns 89' and the sacrificial capping patterns 71S and 72S as etch masks to form the buried contact holes 91. Some embodiments provide that the source and drain regions 67 and the isolation layer 57 may be partially exposed at the bottoms of the buried contact holes 91.

As a result, first upper insulating patterns (not shown) may remain below the first mask patterns 81 and 82, and second upper insulating patterns 89'' may remain below the second mask patterns 89'. The second upper insulating patterns 89'' may be formed to a width smaller than the resolution limit of photolithography.

In some embodiments, the first mask patterns 81 and 82 and the second mask patterns 89' may be formed parallel to each other. Some embodiments provide that the sacrificial capping patterns 71S and 72S may be formed perpendicular to the first mask patterns 81 and 82 and the second mask patterns 89'. Accordingly, the buried contact holes 91 may be formed in a square when viewed from a plan view.

In some embodiments, buried contact spacers 92 may be formed on sidewalls of the buried contact holes 91. Some embodiments provide that the buried contact spacers 92 may be formed of a silicon oxide layer, a silicon nitride layer, a silicon oxynitride layer, and/or a combination thereof.

Figure 12:
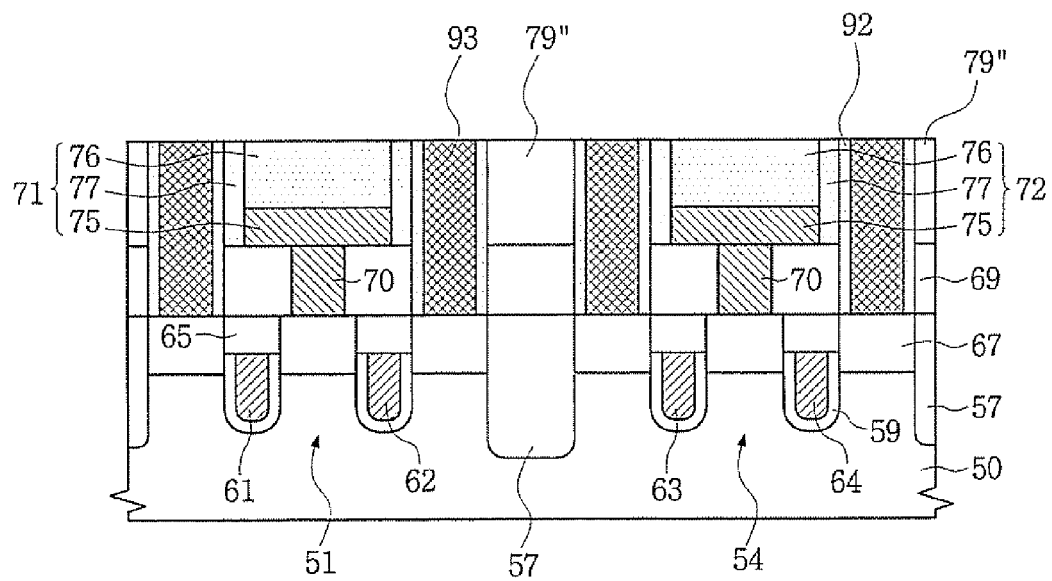

Referring to FIGS. 10 and 12, buried contact plugs 93 filling the buried contact holes 91 may be formed. Some embodiments provide that the buried contact plugs 93 may be formed of a conductive layer such as a polysilicon layer, a metal layer, a metal silicide layer, a metal nitride layer, and/or a combination thereof.

More specifically, some embodiments provide that a buried contact conductive layer filling the buried contact holes 91 and covering the semiconductor substrate 50 may be formed. In some embodiments, the buried contact conductive layer may be planarized until the bit patterns 71, 72 and 73 are exposed to form the buried contact plugs 93. A CMP process and/or an etch-back process may be employed to planarize the buried contact conductive layer. In such embodiments, all of the first mask patterns 81 and 82, the second mask patterns 89', the sacrificial capping patterns 71S and 72S and/or the second sacrificial patterns 88' may be removed.

Figure 13A:
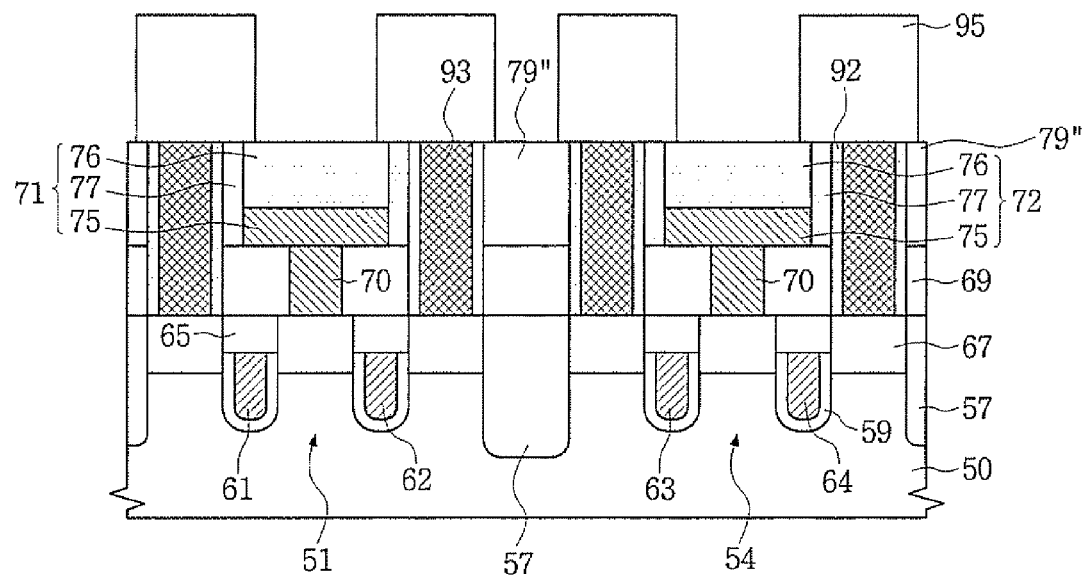
Figure 13B:
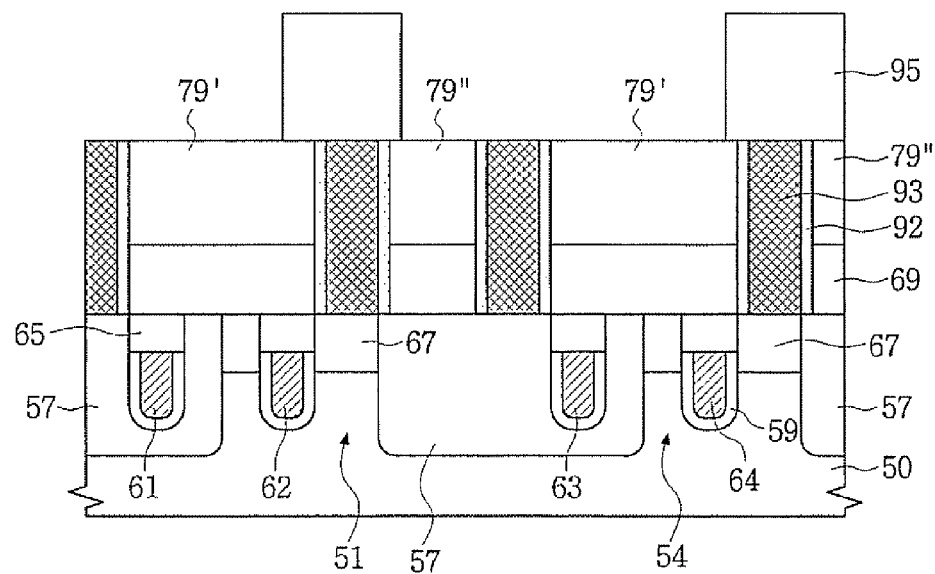
FIG. 13b is a cross-sectional view taken along line II-II' of FIG. 10.

Referring to FIGS. 10, 13a and 13b, storage nodes 95 may be formed on the buried contact plugs 93. In some embodiments, the storage nodes 95 may act as a lower electrode of a capacitor. Some embodiments provide that the storage nodes 95 may be formed of a conductive layer such as a polysilicon layer, a metal layer, a metal silicide layer, a metal nitride layer, and/or a combination thereof. In some embodiments, the storage nodes 95 may be electrically connected to the source and drain regions 67 through the buried contact plugs 93.

A dynamic random access memory (DRAM) according to some embodiments of the present invention will now be described with reference to FIGS. 10, 13a and 13b again. The DRAM has been described through the manufacturing method described with reference to FIGS. 1 to 13b. Only select features of embodiments of the present invention will be briefly described below.

Referring again to FIGS. 10, 13a and 13b, bit patterns 71, 72 and 73 parallel to each other may be provided on a semiconductor substrate 50. In some embodiments, buried word lines 61, 62, 63 and 64 disposed parallel to each other may be provided at a lower level than the bit patterns 71, 72 and 73. Some embodiments provide that the bit patterns 71, 72 and 73 may be disposed to cross the buried word lines 61, 62, 63 and 64. Furthermore, some embodiments provide that the bit patterns 71, 72 and 73 may be disposed perpendicular to the buried word lines 61, 62, 63 and 64.

Active regions 51, 52, 53 and 54 spaced apart from one another may be disposed at intersections of the bit patterns 71, 72 and 73 and the buried word lines 61, 62, 63 and 64. In some embodiments, the active regions 51, 52, 53 and 54 may be defined by an isolation layer 57 formed in the semiconductor substrate 50. Some embodiments provide that the active regions 51, 52, 53 and 54 may be formed to be two-dimensionally aligned along a column direction and a row direction. In some embodiments, the active regions 51, 52, 53 and 54 may be aligned parallel to one another. For example, some embodiments provide that a second active region 52 may be aligned in the column direction with respect to a first active region 51, a third active region 53 may be aligned in the row direction with respect to the first active region 51, and a fourth active region 54 may be aligned in the row direction of the second active region 52.

The buried word lines 61, 62, 63 and 64 may be formed to cross the active regions 51, 52, 53 and 54 and the isolation layer 57. In some embodiments, the buried word lines 61, 62, 63 and 64 may be formed to obliquely cross the active regions 51, 52, 53 and 54. In some embodiments, source and drain regions 67 may be provided in the active regions 51, 52, 53 and 54 at both sides of the buried word lines 61, 62, 63 and 64. Some embodiments provide that the buried word lines 61, 62, 63 and 64 may be disposed at a lower level than upper surfaces of the source and drain regions 67. Gate dielectric layers 59 may be interposed between the buried word lines 61, 62, 63 and 64 and the active regions 51, 52, 53 and 54. In some embodiments, the buried word lines 61, 62, 63 and 64 may be covered by word capping patterns 65.

As illustrated, a first buried word line 61 may be disposed to cross the first and third active regions 51 and 53. In some embodiments, each of the first and third active regions 51 and 53 may be disposed to obliquely cross the first buried word line 61. Some embodiments provide that a second buried word line 62 may be disposed parallel to the first buried word line 61 and across the first and third active regions 51 and 53. Similarly, in some embodiments, third and fourth buried word lines 63 and 64 may be disposed to cross the second and fourth active regions 52 and 54.

The word capping patterns 65, the source and drain regions 67 and the isolation layer 57 may be covered with a lower insulating layer 69. The lower insulating layer 69 may act as an interlayer insulating layer. In some embodiments, the bit patterns 71, 72 and 73 may be disposed on the lower insulating layer 69 and may be connected to the source and drain regions 67 by bit plugs 70 passing through the lower insulating layer 69. The bit patterns 71, 72 and 73 may include bit lines 75 and bit capping patterns 76, which are sequentially stacked. Some embodiments provide that the bit patterns 71, 72 and 73 may include bit spacers 77 covering sidewalls of the bit lines 75 and the bit capping patterns 76.

In some embodiments, the bit patterns 71, 72 and 73 may be disposed to obliquely cross over the active regions 51, 52, 53 and 54. In such embodiments, the active regions 51, 52, 53 and 54 may be obliquely disposed at intersections of the bit patterns 71, 72 and 73 and the buried word lines 61, 62, 63 and 64. More specifically, some embodiments provide that a first bit pattern 71 may be disposed to cross over the first and second active regions 51 and 52. Similarly, in some embodiments, a second bit pattern 72 may be disposed to cross over the third and fourth active regions 53 and 54.

First and second upper insulating patterns 79' and 79'' may be provided in a gap region between the bit patterns 71, 72 and 73. In some embodiments, the first and second upper insulating patterns 79' and 79'' may be disposed on the lower insulating layer 69. The buried word lines 61, 62, 63 and 64 may be covered with the first upper insulating patterns 79' and the lower insulating layer 69. Some embodiments provide that the first upper insulating patterns 79' and the lower insulating layer 69 may be disposed to cover between the first and second buried word lines 61 and 62. Similarly, between the third and fourth buried word lines 63 and 64 may be covered with the first upper insulating patterns 79' and the lower insulating layer 69.

In some embodiments, the second upper insulating patterns 79'' may be self-aligned between the first upper insulating patterns 79'. That is, the second upper insulating patterns 79'' may be provided at a midpoint between the first upper insulating patterns 79'. Some embodiments provide that the second upper insulating patterns 79'' may have a width smaller than the resolution limit of photolithography. The lower insulating layer 69 may remain below the second upper insulating patterns 79''.

Buried contact plugs 93 contacting the source and drain regions 67 through the lower insulating layer 69 may be provided between the first and second upper insulating patterns 79' and 79''. In some embodiments, the buried contact plugs 93 may be self-aligned between the bit patterns 71, 72 and 73. Some embodiments provide that the buried contact plugs 93 may have a width smaller than the resolution limit of photolithography. In some embodiments, buried contact spacers 92 may be interposed between the bit patterns 71, 72 and 73 and the buried contact plugs 93.

In some embodiments, storage nodes 95 may be provided on the buried contact plugs 93. The storage nodes 95 may act as a lower electrode of a capacitor. In some embodiments, the storage nodes 95 may be electrically connected to the source and drain regions 67 through the buried contact plugs 93.

As described above, according to some embodiments of the present invention, interconnection patterns parallel to each other may be formed on a semiconductor substrate. First mask patterns crossing the interconnection patterns and parallel to each other may be formed. A second mask pattern self-aligned to the first mask patterns may be formed between the first mask patterns. An upper insulating layer and a lower insulating layer may be etched using the first and second mask patterns and the interconnection patterns as etch masks to form contact holes exposing the semiconductor substrate. A contact plug may be formed in the contact holes. The contact holes may be self-aligned between the mask patterns and the interconnection patterns. Accordingly, the contact plug may be formed with a sufficient process margin. As a result, a semiconductor device suitable for high integration density may be implemented.

Although the present invention has been described in terms of specific embodiments, the present invention is not intended to be limited by the embodiments described herein. Thus, the scope may be determined by the following claims.

What is claimed is:

1. A method of fabricating a semiconductor device, comprising:

forming a lower insulating layer on a semiconductor substrate;

forming a plurality of interconnection patterns parallel to each other on the lower insulating layer;

forming an upper insulating layer that is configured to fill between the interconnection patterns;

forming a plurality of first mask patterns crossing the plurality of interconnection patterns, ones of the plurality of first mask patterns parallel to each other on the semiconductor substrate having the upper insulating layer;

forming a second mask pattern that is self-aligned to the plurality of first mask patterns and that is between ones of the plurality of first mask patterns;

etching the upper insulating layer and the lower insulating layer using the first and second mask patterns and the plurality of interconnection patterns as etch masks to form a plurality of contact holes exposing the semiconductor substrate; and forming a plurality of contact plugs in respective ones of the plurality of contact holes, wherein the second mask pattern is spaced apart from the plurality of mask patterns.

2. The method of claim 1, wherein forming the plurality of first mask patterns comprises:

forming a first sacrificial layer on the semiconductor substrate having the upper insulating layer;

forming a first mask layer on the first sacrificial layer; and patterning the first mask layer and the first sacrificial layer.

3. The method of claim 1, wherein forming the plurality of first mask patterns comprises forming the plurality of first mask patterns perpendicular to the plurality of interconnection patterns.

4. The method of claim 1, wherein forming the second mask pattern comprises:

forming a second sacrificial layer covering the semiconductor substrate having the plurality of first mask patterns;

forming a second mask layer that fills between the first mask patterns and covers the second sacrificial layer; and planarizing the second mask layer.

5. The method of claim 1, wherein forming the plurality of interconnection patterns comprises:

forming a conductive layer on the lower insulating layer;

forming a capping layer on the conductive layer; and patterning the capping layer and the conductive layer to form capping patterns and interconnections.

6. The method of claim 1, further comprising:

before forming the first mask patterns, etching-back the plurality of interconnection patterns to form grooves; and forming sacrificial capping patterns to fill the grooves using the same material layer as the second mask pattern.

7. A method of fabricating a dynamic random access memory (DRAM), comprising:

defining a plurality of active regions that are two-dimensionally aligned along a column direction and a row direction in a semiconductor substrate;

forming a lower insulating layer on the semiconductor substrate that includes the plurality of active regions;

forming a plurality of bit patterns crossing the plurality of active regions, ones of the plurality of bit patterns parallel to each other on the lower insulating layer;

forming an upper insulating layer that is configured to fill between ones of the plurality of bit patterns;

forming a plurality of first mask patterns crossing the plurality of bit patterns, ones of the plurality of first mask patterns parallel to each other on the semiconductor substrate that includes the upper insulating layer;

forming a second mask pattern self-aligned to the plurality of first mask patterns between ones of the plurality of first mask patterns;

etching the upper insulating layer and the lower insulating layer using the plurality of first mask patterns, the second mask pattern and the plurality of bit patterns as etch masks to form a plurality of buried contact holes exposing the plurality of active regions;

forming a plurality of buried contact plugs in the plurality of buried contact holes; and forming a plurality of storage nodes on respective ones of the plurality of buried contact plugs, wherein the second mask pattern is spaced apart from the plurality of first mask patterns.

8. The method of claim 7, wherein the plurality of first mask patterns are formed perpendicular to the bit patterns, and wherein intersections of ones of the plurality of first mask patterns and ones of the plurality of bit patterns are disposed on the active regions.

9. The method of claim 8, wherein intersections of the second mask pattern and ones of the plurality of bit patterns are disposed between the active regions.

10. The method of claim 7, wherein forming the plurality of bit patterns comprises:

forming a bit conductive layer on the lower insulating layer;

forming a bit capping layer on the bit conductive layer; and patterning the bit capping layer and the bit conductive layer to form a plurality of bit capping patterns and bit lines.

11. The method of claim 7, further comprising:

before forming the plurality of first mask patterns, etching-back the plurality of bit patterns to form a plurality of grooves; and forming a plurality of sacrificial capping patterns that are configured to fill the plurality of grooves using the same material layer as the second mask pattern.

12. The method of claim 7, wherein forming the plurality of first mask patterns comprises:

forming a first sacrificial layer on the semiconductor substrate including the upper insulating layer;

forming a first mask layer on the first sacrificial layer; and patterning the first mask layer and the first sacrificial layer.

13. The method of claim 12, wherein the first mask layer comprises a polysilicon layer.

14. The method of claim 7, wherein forming the second mask pattern comprises:

forming a second sacrificial layer covering a surface of the semiconductor substrate having the plurality of first mask patterns;

forming a second mask layer which fills between ones of the plurality of first mask patterns and covers the second sacrificial layer; and planarizing the second mask layer.

15. The method of claim 14, wherein the second mask layer comprises a polysilicon layer.

16. The method of claim 7, further comprising:

before forming the lower insulating layer, forming a plurality of buried word lines crossing the plurality of active regions, ones of the plurality of buried word lines parallel to each other; and forming a plurality of word capping patterns covering the plurality of buried word lines, wherein the plurality of buried word lines are disposed at a lower level than upper surfaces of the plurality of active regions.

17. The method of claim 1, wherein each of the contact holes is disposed between the first mask pattern and the second mask pattern.

* * * * *